(12) United States Patent
Jayaraman et al.

(10) Patent No.: US 7,671,997 B2
(45) Date of Patent: Mar. 2, 2010

(54) HIGH POWER BROADBAND SUPERLUMINESCENT DIODE

(76) Inventors: Vijaysekhar Jayaraman, 270 Coronado Dr., Goleta, CA (US) 93117; Eric Hall, 220 E. Figueroa #1, Santa Barbara, CA (US) 93101

( * ) Notice: Subject to any disclaimer, the term of this patent is extended or adjusted under 35 U.S.C. 154(b) by 170 days.

(21) Appl. No.: 11/981,157

(22) Filed: Oct. 30, 2007

(65) Prior Publication Data

US 2009/0066965 A1 Mar. 12, 2009

Related U.S. Application Data

(60) Provisional application No. 60/855,425, filed on Oct. 31, 2006.

(51) Int. Cl.
*G01B 11/02* (2006.01)
*H01L 31/00* (2006.01)

(52) U.S. Cl. .................................... 356/497; 257/14

(58) Field of Classification Search ............... 356/479, 356/497; 257/E33.054, 14; 372/39, 43.01
See application file for complete search history.

(56) References Cited

U.S. PATENT DOCUMENTS

| | | | |
|---|---|---|---|
| 5,034,956 A | | 7/1991 | Gessner et al. |
| 5,459,570 A | * | 10/1995 | Swanson et al. ............. 356/479 |
| 5,521,935 A | * | 5/1996 | Irikawa .................. 372/45.011 |
| 7,045,812 B2 | | 5/2006 | Lin et al. |

OTHER PUBLICATIONS

Selmic, Sandra R. et al. "Design and Characterization of 1.3-μm AlGaInAs-InP Mutliple-Quantum-Well Lasers". IEEE Journal on Selected Topics in Quantum Electronics, vol. 7, No. 2, Mar./Apr. 2001, pp. 340-349.*
Hsieh, Shang-Wei et al. "Simulation of 1.3-μm AlGaInAs/InP strained MQW lasers". Semiconductor Lasers and Applications II, Proceedings of SPIE vol. 5628, Jan. 2005, pp. 318-326.*
Yen, Sheng-Horng et al. "Design and Analysis of 1.3-μm AlGaInAs/InP MQW Lasers". OPT 2005 Proceedings, 2005, pp. 1-3.*
A.T. Semenov, V.R. Shidlovski, S.A. Safin, "Wide Spectrum Single Quantum Well Superluminescent Diodes . . . ," Electronics Letters, vol. 29, No. 10, May 13, 1993, pp. 854-856.

(Continued)

*Primary Examiner*—Michael A Lyons

(57) ABSTRACT

A superluminescent diode according the present invention employs a uniform AlGaInAs quantum well on an InP substrate, emitting in a range of 1100 to 1800 nm. The favorable conduction band: valence band offset ratio of this material system enables superluminescent diodes which simultaneously provide high power and large optical bandwidth. A recent reduction to practice of the present invention simultaneously demonstrates output power exceeding 100 mW and bandwidth exceeding 100 nm. A preferred embodiment of this invention uses multiple uniform AlGaInAs quantum wells with two confined quantum states and energetic separation in a range of 100-130 nm. An alternate preferred embodiment uses non-uniform wells, with each well having two confined quantum states. The present invention is particularly useful in time domain and spectral domain optical coherence tomography systems, providing increased resolution and tissue penetration for in-vivo imaging.

21 Claims, 4 Drawing Sheets

OTHER PUBLICATIONS

C-F Lin, B-L Lee, P-C Lin, "Broad-Band Superluminescent Diodes Fabricated on a Substrate . . . ," IEEE Photonics Technology Letters, vol. 8, No. 11, Nov. 1996, pp. 1456-1458.

C-F-Lin, B-R Wu, L-W Laih, T-T-Shih, "Sequence Influence of Non-Identical InGaAsP Quantum Wells on Broadband . . . " Optics Letters, vol. 26, No. 14, Jul. 2001, pp. 1099-1101.

J.H Song, S.H. Cho, I.K. Han, Y. Hu, P.J. S. Heim, F.G. Johnson, D.R. Stone, M. Dagenais, "High Power . . . " IEEE Photonics Letters, vol. 12, No. 7, Jul. 2000, pp. 783-785.

C.E. Zah, R. Bhat, B.N. Pathak, F. Faivre, W. Lin, M.C. Wang, N.C. Andreakis, D.M. Hwang, "High . . . " IEEE Journal of Quantum Electronics, vol. 30, No. 2, Feb. 1994, pp. 511-523.

* cited by examiner

HIGH POWER BROADBAND SUPERLUMINESCENT DIODE

CROSS-REFERENCES TO RELATED APPLICATIONS

This application is entiltled to the benefit of Provisional Patent Application Ser. No. 60/855,425, filed on Oct. 31, 2006.

STATEMENT REGARDING FEDERALLY SPONSORED RESEARCH OR DEVELOPMENT

This invention was made under a government grant 5R44CA101067. The U.S. government has rights in this invention.

BACKGROUND-FIELD OF THE INVENTION

This invention relates generally to broadband light sources and superluminescent diodes.

BACKGROUND

Semiconductor superluminescent diodes (SLDs) are compact inexpensive light sources for many applications that require large spectral bandwidth. The spectral bandwidth of commercially available SLDs is typically 20-50 nanometers (nm). Many applications would benefit from larger bandwidths. For example, the axial resolution of an optical coherence tomography (OCT) system is effectively the coherence length of the light source, which is inversely proportional to the optical bandwidth of the source. For very fine resolution (<10 um), such as that needed for tissue imaging in OCT, wide bandwidth sources (>100 nm) are required. Wide bandwidth in conjunction with high power is also desirable, since this enables deeper tissue penetration.

Researchers have employed quantum-well active regions exhibiting simultaneous emission from both the first and second quantized state to expand the bandwidth of SLD-based light sources. These sources have primarily been GaAs-based with spectral centers near 850 nm, making them useful in OCT systems for ophthalmology, for example. See for example (A. T. Semenov, V. R. Shidlovksi, S. A. Safin, Wide Spectrum Single Quantum Well Superluminescent Diodes at 0.8 um With Bent Optical Waveguide, Electronics Letters Vol. 29, No. 10, 13 May 1993) and also (C-F Lin, B-L Lee, C-P Lin, "Broad-Band Superluminescent Diodes Fabricated on a Substrate with Asymmetric Dual Quantum Wells," IEEE Photonics Technology Letters, Vol. 8, No 11, November 1996.)

For applications that require light sources centered between 1100 nm and 1800 nm, researchers have employed both non-uniform well widths and multi-state quantum wells using the InGaAsP/InP material system. See for example (C-F Lin, B-R Wu, L-W Laih, and T-T Shih, "Sequence Influence of Non-identical InGaAsP Quantum Wells on Broadband Characteristics of Semiconductor Optical Amplifiers—Superluminescent Diodes," *Optics Letters*, Vol. 26, No. 14, July 2001 and U.S. Pat. No. 7,045,812). See also (J. H. Song, S. H. Cho, I. K Han, Y. Hu, P. J. S Heim, F. G. Johnson, D. R. Stone, and M. Dagenais, "High Power Broadband Superluminescent Diode with Low Spectral Modulation at 1.5 µm Wavelength," *IEEE Photonics Technology Letters*, vol. 12, no. 7, July 2000). In the InGaAsP/InP material system, however, the majority of the band offset resides in the valence band with the conduction-valence band offset ratio being approximately 40:60. This shallow conduction band potential and correspondingly larger valence band potential creates non-uniform charge injection in multi-quantum well structures, reduced thermal and output power performance, particularly in multi-state or non-uniform well width applications, and limited achievable state separation and spectral bandwidth. The consequence for prior art SLDs has been devices which cannot simultaneously achieve high output power and broad optical bandwidth. The results of (J. H. Song, S. H. Cho, I. K Han, Y. Hu, P. J. S Heim, F. G. Johnson, D. R. Stone, and M. Dagenais, "High Power Broadband Superluminescent Diode with Low Spectral Modulation at 1.5 µm Wavelength," *IEEE Photonics Technology Letters*, vol. 12, no. 7, July 2000), demonstrate 130 nm bandwidth around 1.5 microns, with raw continuous wave output powers near 10 mW at room temperature. These are some of the best results to date, but the reported powers do not approach the ~50 mW values achievable with narrower bandwidth devices, nor have similar results been reported near 1.3 microns, which is important for OCT systems for tissue imaging.

More recently, self-assembled quantum dots have also been proposed as an active medium for broad bandwidth SLDs. Although this scheme enables broad optical bandwidth, the small fill factor of quantum dot structures leads to limited gain and output power, so high output powers have not thus far been achieved. Additionally, quantum dot sizes are difficult to control, making center wavelength and bandwidth of quantum dot SLDs unpredictable and un-manufacturable From the foregoing, it is clear that what is required is an SLD design in the 1100-1800 nm region that simultaneously provides high power, broad optical bandwidth, and manufacturability.

SUMMARY OF THE INVENTION

The present invention provides a semiconductor-based superluminescent diode in the 1100 nm to 1800 nm region using at least one strained AlGaInAs quantum well grown on an Indium Phosphide substrate. This AlGaInAs quantum well has a deep conduction: valence band offset ratio of approximately 72:28, enabling wide state separation, uniform charge injection, and good thermal and output power performance. A preferred embodiment uses 3 quantum wells in the range of 8-14 nm well width each, providing two quantum confined states with controllable wavelengths, and emitted output power exceeding 50 mW with a bandwidth exceeding 100 nm.

In one preferred embodiment, each of the AlGaInAs quantum wells has the same composition and thickness, leading to higher output power while maintaining bandwidth in excess of 100 nm. In another preferred embodiment, the well widths are non-uniform to increase spectral range well beyond 100 nm at the expense of reduced gain. In all such multi-quantum well situations, the small valence band offsets of the AlGaInAs material system facilitate controllable wide-bandwidth operation, and high output power and gain due to the large conduction band offset relative to the valence band offset.

BRIEF DESCRIPTION OF THE DRAWINGS

Understanding of the present invention will be facilitated by referring to following Figures.

REFERENCE NUMERALS IN DRAWINGS

100 Ridge waveguide in SLD according to present invention.
110 Normal to facet.
120 Output facet.
130 Broadband radiation emitted by SLD.
140 AlGaInAs quantum well gain region in SLD according to present invention.
200 Room temperature light power curve achieved by SLD fabricated according to present invention.
210 Spectra achieved by SLD fabricated according to present invention
220 First quantum state emission peak.
230 Second quantum state emission peak.
300 Quantum wells in preferred uniform well embodiment of SLD according to present invention.
310 Active region in preferred uniform well embodiment of SLD according to present invention.
320 Well width in preferred uniform well embodiment of SLD according to present invention.
330 Quantum well barriers in preferred uniform well embodiment of SLD according to present invention.
340 First quantum state in preferred uniform well embodiment of SLD according to present invention.
350 Second quantum state in preferred uniform well embodiment of SLD according to present invention.
360 Energetic separation of quantum states in preferred uniform well embodiment of SLD according to present invention.
400 Active region in preferred non-uniform well embodiment of SLD according to present invention.
410 First quantum well in preferred non-uniform well embodiment of SLD according to present invention.
420 First quantum state of first quantum well.
430 Second quantum state of first quantum well.
440 Second quantum well in preferred non-uniform well embodiment of SLD according to present invention.
450 First quantum state of second quantum well.
460 Second quantum state of second quantum well.

DETAILED DESCRIPTION OF THE PREFERRED EMBODIMENTS

Figure 1:
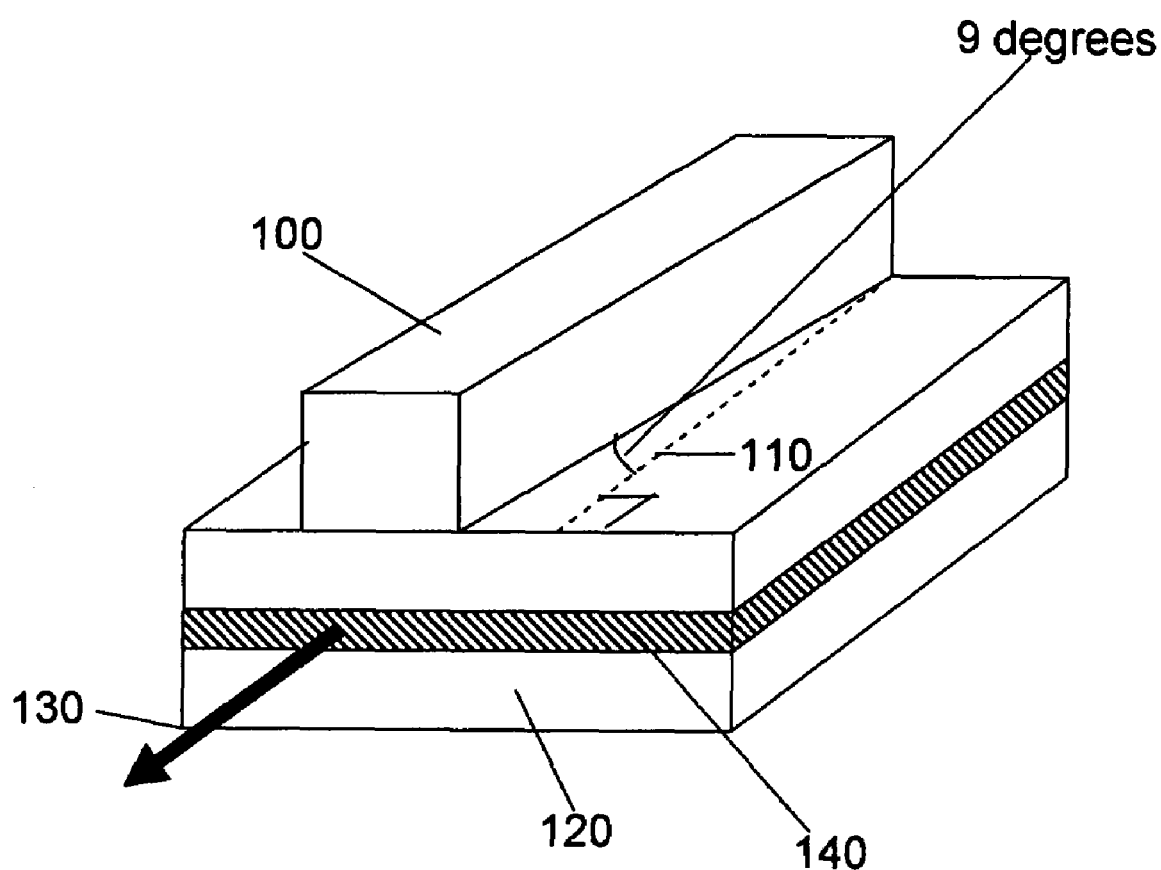
FIG. 1 is a schematic representation of an SLD according to the present invention.

The present invention provides a superluminescent diode (SLD) on an InP substrate with an AlGaInAs quantum well gain region. FIG. 1 illustrates a preferred embodiment of the present invention, in which a ridge waveguide 100 oriented at about 9 degrees away from a normal 110 to a cleaved facet 120 provides electrical and optical confinement and guides amplified radiation to an output 130. The 9 degree ridge angle effectively suppresses facet reflections and undesired laser action or spectral narrowing. Alternate ridge angles could also be employed without departing from the spirit and scope of the invention as well as other methods for optical guiding and current confinement, such as the use of a buried heterostructure or implantation. Optical gain is provided along the guided region by an AlGaInAs-based quantum well gain region 140 in which both wells and barriers can be defined in composition by parameters x, y in $Al_yGa_xIn_{1-x-y}As$. In the preferred embodiment, light output from facet 120 is coupled into an optical fiber or external wave-guiding element, but the light can also be directly incident on the sample of interest.

Figure 2:
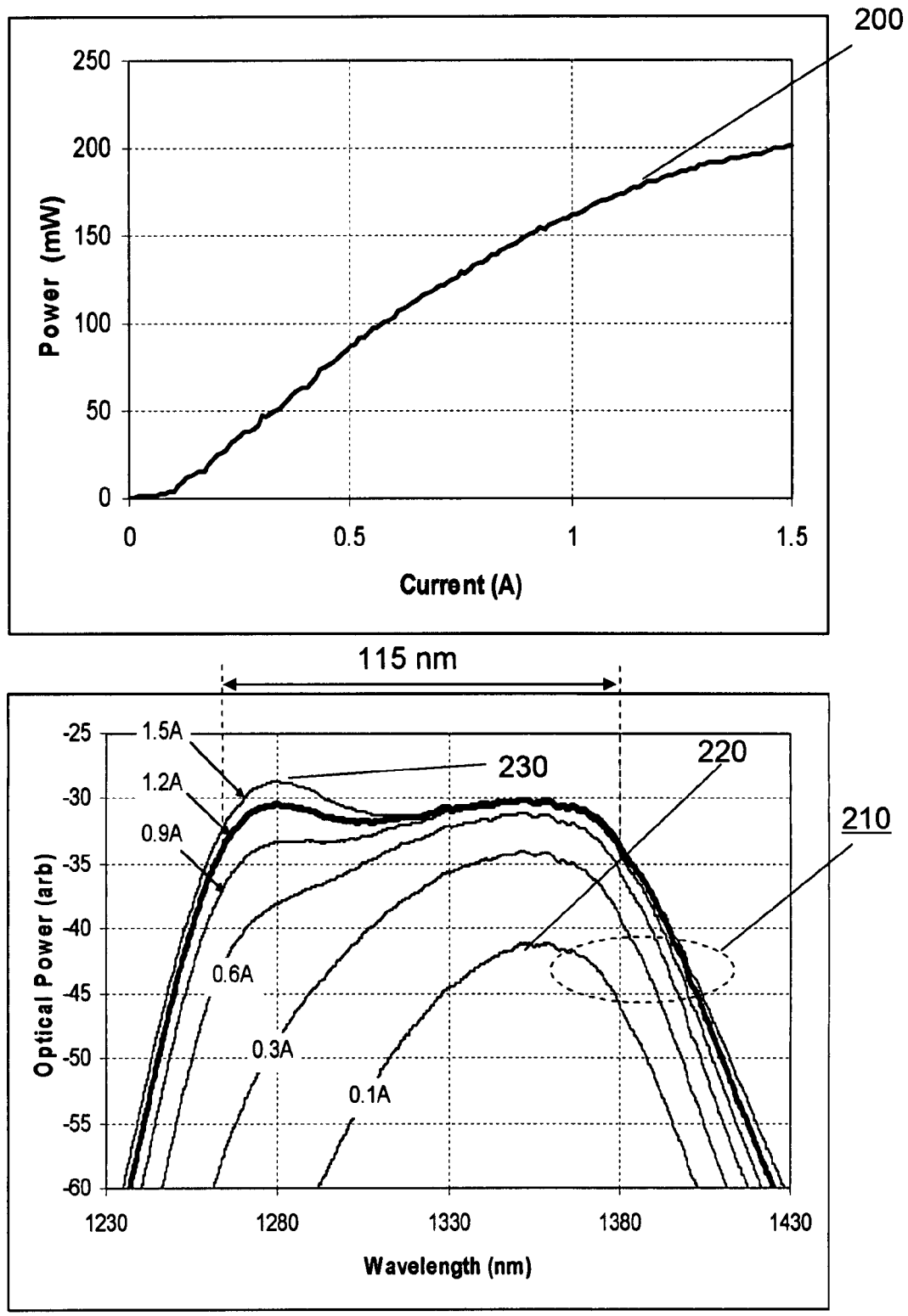
FIG. 2 is a schematic representation of power and optical bandwidth results obtained by reducing the present invention to practice.

The advantages of the AlGaInAs material system over InGaAsP for lasers have previously been described, as for example in (Gessner, et al, U.S. Pat. No. 5,034,956, "Semiconductor Laser in the System GaAlInAs," Jul. 23, 1991) and in (C. E. Zah, R. Bhat, B. N. Pathak, F. Favire, W. Lin, M. C. Wang, N. C. Andreakis, D. M. Hwang, M. A. Koza, T. P. Lee, Z. Wang, D. Darby, D. Flanders, J. J.Hsieh, "High Performance Uncooled 1.3 μm $Al_xGa_yIn_{1-x-y}As$/InP strained layer quantum well lasers for subscriber loop applications," IEEE Journal of Quantum Electronics, vol. 30, no. 2 February 1994, pp. 511-523). The advantages of AlGaInAs for broadband superluminescent diodes, however, have not thus far been obvious or documented in the literature, since all prior art SLD results in the 1100-1800 nm range rely on InGaAs or InGaAsP quantum wells or quantum dots, or multiple layered wells where the gain producing region is InGaAs. FIG. 2 illustrates spectral and power results obtained by recent reduction to practice of the present invention. An AlGaInAs SLD with 3 identical quantum wells with two states around 1300 nm simultaneously demonstrates for the first time power in excess of 100 mW and bandwidth in excess of 100 nm. In the top of FIG. 2, a pulsed room-temperature (about 20C) light-intensity (L-I) curve 200 illustrates a power of about 170 mW at a current drive of about 1.2 Amps. A set of spectra 210 illustrates how the 3-db bandwidth at 1.2 A and 170 mW output power is approximately 115 nm. Under room temperature CW operation, this power will be approximately 50% of the pulsed output power, based on existing data for similar devices. Thus CW powers around 85 mW are possible in conjunction with 115 nm bandwidth. This 85 mW power is substantially higher than that reported for a state of the art multi-state InGaAsP SLD structure in (J. H. Song, S. H. Cho, I. K Han, Y. Hu, P. J. S Heim, F. G. Johnson, D. R. Stone, and M. Dagenais, "High Power Broadband Superluminescent Diode with Low Spectral Modulation at 1.5 μm Wavelength," IEEE Photonics Technology Letters, vol. 12, no. 7, July 2000). Even when the L-I curves of this prior art reference are extrapolated to currents near 1.2 A, the powers are less than 20 mW. In practice thermal effects will not enable even 20 mW to be obtained with InGaAsP devices of the reference above.

Figure 3:
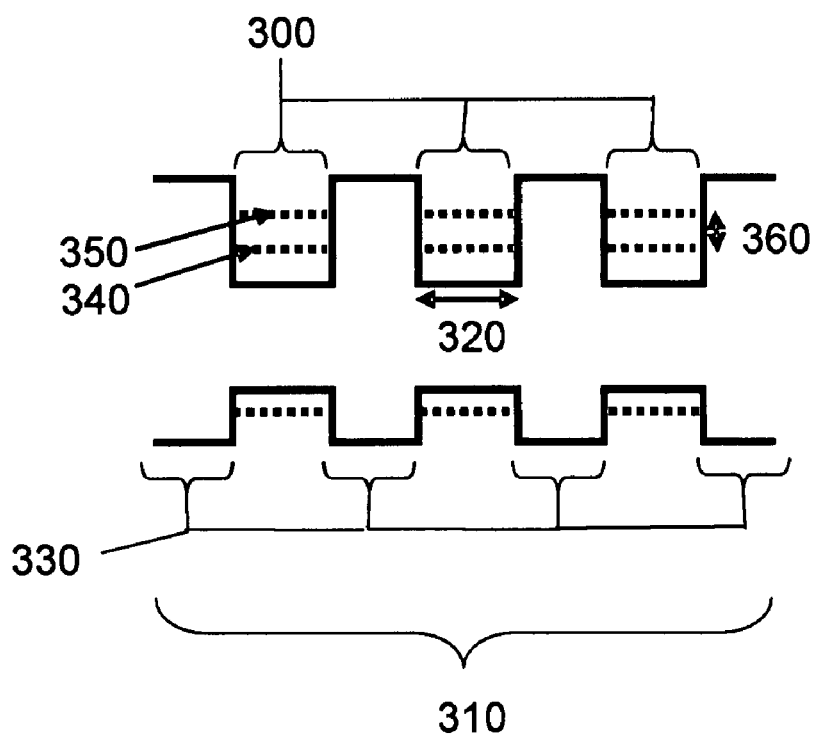
FIG. 3 is a band diagram of a preferred embodiment of the present invention using 3 identical AlGaInAs quantum wells.

The details of a 3-quantum well active region used to obtain the results of FIG. 2 are illustrated in FIG. 3. Each of 3 quantum wells 300 of an active region 310 is designed to provide a ground state photoluminescence peak between about 1330 and 1380 nm. Typical compositions of the wells 300 are defined by Al(0.20)In(0.67)Ga(0.13)As. Typical well widths 320 are between about 8 and about 14 nm. This large well width highlights another advantage of the AlGaInAs system over the InGaAsP system: large energetic separation is achieved at larger well widths, enabling greater control and manufacturability. In the InGaAsP system, however, wide separation requires narrower less controllable well widths. In the preferred embodiment, the quantum wells 300 are compressively-strained and barriers 330 are tensile strained to provide strain compensation. Typical barrier composition is about Al(0.2)In(0.46) Ga(0.34)As. Widths of the barriers are typically between 10 nm and 12 nm, and tensile strain levels are typically −0.5%. FIG. 3 also shows schematically a first quantized conduction band energy level 340 and second quantized conduction band energy level 350 of the quantum wells, which are also functions of the width and compositions discussed above. The energy levels 340 and 350 have an energetic separation 360, which directly defines the spectral range of the light source. The preferred range for 360 is 100-130 nm for SLDs centered near 1310 nm.

FIG. 2, in addition to demonstrating wide bandwidth and high power from the design of FIG. 3, also illustrates how the spectrum and power evolve with injected current. The spectra 210 correspond to different injected currents. A first emission peak 220 is seen to appear which corresponds to the first quantized state. At higher injection currents a second emission peak 230 appears which corresponds to the second quantized state.

Figure 4:
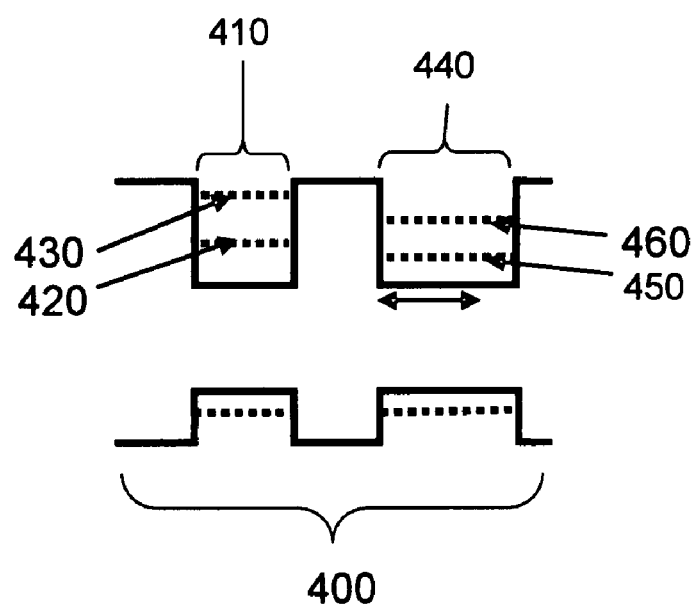
FIG. 4 is a band diagram of a preferred embodiment of the present invention using non-identical AlGaInAs quantum wells.

An example of another preferred embodiment of the active region is shown schematically in FIG. 4. Here, an active region 400 is comprised of a first AlGaInAs quantum well 410 with first quantized state 420 and second quantized state 430 and a second AlGaInAs quantum well 440 with a first quantized state 450 and second quantized state 460 such that none of the states are identical in energy. A configuration of this type can be achieved through the modification of well composition, well width, or barrier composition.

Other embodiments can have different quantities or combinations of quantum wells with single or multiple quantized states in order to achieve the desired spectral bandwidth, spectral shape, and center wavelength while also considering other performance parameters such as power.

Figure 5:
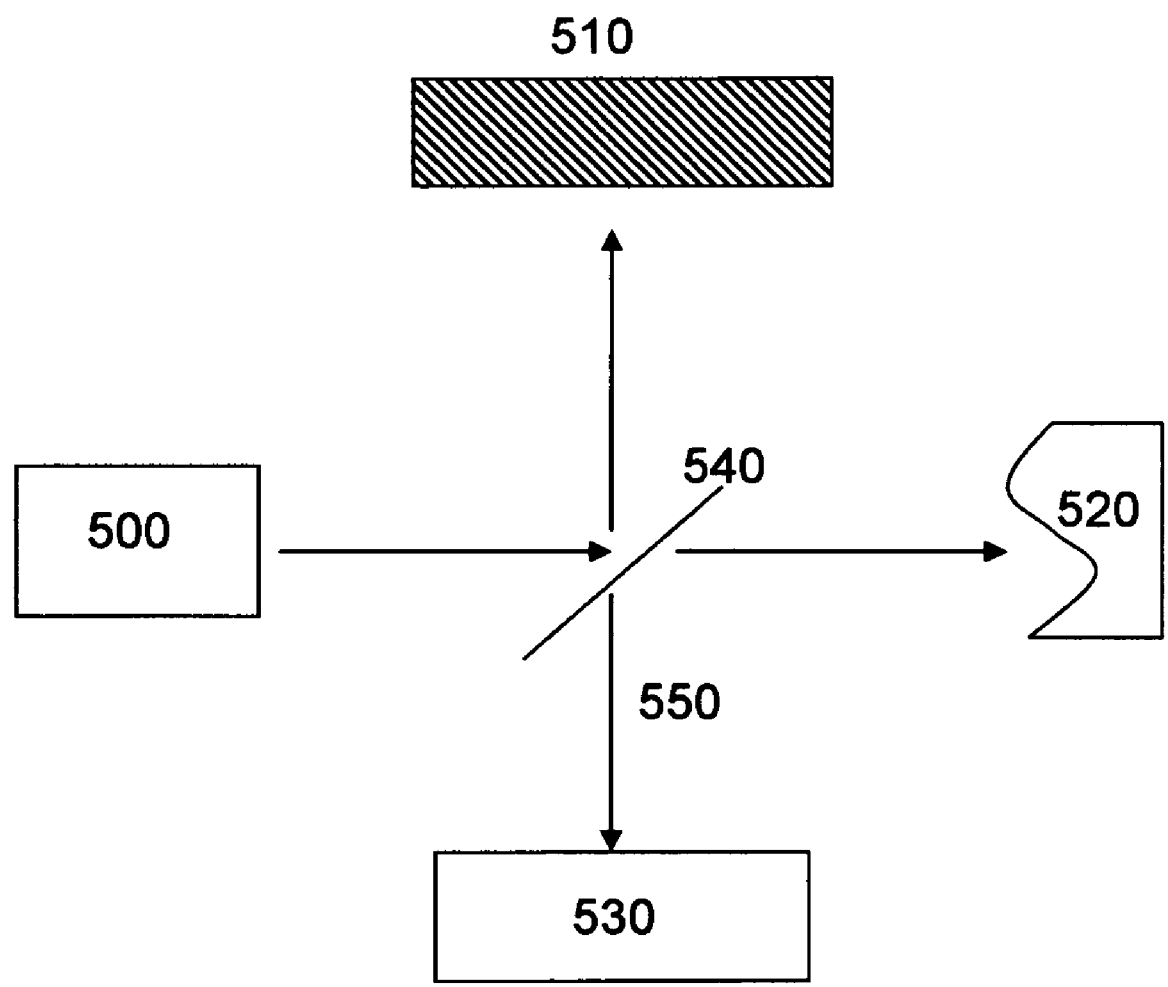
FIG. 5 represents an OCT system in accordance with the present invention.

One important application of the AlGaInAs superluminescent diodes described herein is in high-resolution Optical Coherence Tomography (OCT) imaging systems. OCT systems are emerging as a way of in-vivo imaging of human tissue, using superluminescent diodes typically having a center wavelength of emission around 1310 nm. Although the 1310 nm band is preferred, other center wavelengths of interest include the 1800 nm band for imaging water content, and the 1550 nm band for imaging or spectrally sliced long-haul communication systems. An OCT system shown in FIG. 5 employs an AlInGaAs SLD diode source 500, a splitter 540 which directs light to a reference mirror 510 and a sample 520, and a detector 530 which detects an interference 550 between sample reflection and reference mirror reflection. The detector 530 is either a simple broadband detector for time-domain OCT systems, or a spectrally resolved detector for emerging spectral domain OCT systems. Spectral domain and time domain OCT systems are well-known to those skilled in the art of Optical Coherence tomography. The large bandwidth of the present invention can be used to increase the spatial resolution, and the high power can be used to increase tissue penetration depth of emerging OCT systems of various kinds. In addition, light output from a number of superluminescent diodes according to the present invention can be multiplexed to increase optical bandwidth and OCT system spatial resolution even further.

While this invention has been particularly shown and described with references to preferred and alternate embodiments thereof, it will be understood by those skilled in the art that various changes in form and details may be made therein without departing from the spirit and scope of the invention as defined by the appended claims.

What is claimed is:

1. A superluminescent diode light source emitting in a wavelength range of about 1100 nm to about 1800 nm, comprising an InP substrate and at least one AlGaInAs quantum well as a gain element.

2. The superluminescent diode light source of claim 1, wherein said light source simultaneously exhibits a 3-dB bandwidth greater than about 80 nm and a room temperature continuous wave power greater than about 20 mW.

3. The superluminescent diode light source of claim 1, wherein said light source simultaneously exhibits a 3-dB bandwidth greater than about 80 nm and a room temperature continuous wave power greater than about 50 mW.

4. The superluminescent diode light source of claim 1, wherein said quantum well exhibits simultaneous emission from both a first and a second quantized energy level.

5. The superluminescent diode light source of claim 1, further comprising additional AlGaInAs quantum well gain elements.

6. The superluminescent diode light source of claim 5, wherein all of said AlGaInAs quantum well gain elements are substantially uniform in width.

7. The superluminescent diode light source of claim 6, wherein all of said AlGaInAs quantum well gain elements emit in 2 quantum confined states.

8. The superluminescent diode of light source of claim 7, wherein a total number of AlGaInAs quantum well gain elements is exactly 3.

9. The superluminescent diode light source of claim 5, wherein at least one of said AlGaInAs gain elements differs substantially in emission energy from at least one other of said AlGaInAs quantum well gain elements.

10. The superluminescent diode light source of claim 5, wherein said light source simultaneously exhibits a 3-dB bandwidth greater than about 100 nm and a room temperature continuous wave output power greater than about 50 mW.

11. The superluminescent diode light source of claim 8, wherein said light source simultaneously exhibits a 3-dB bandwidth greater than about 100 nm and a room temperature continuous wave output power greater than about 50 mW.

12. The superluminescent diode light source of claim 1 wherein said quantum well has a center wavelength of emission at about 1310 nm.

13. The superluminescent diode light source of claim 1, wherein said quantum well has a center wavelength of emission at about 1550 nm.

14. The superluminescent diode light source of claim 1, where said quantum well has a center wavelength of emission at about 1800 nm.

15. The superluminescent diode light source of claim 1 wherein said quantum well has a width between about 8 nm and 14 nm.

16. The superluminescent diode light source of claim 1 wherein said quantum well has an aluminum composition between about 15 and about 25 percent.

17. A system for optical coherence tomography comprising a superluminescent diode light source emitting in a wavelength range of about 1100 nm to about 1800 nm, comprising an InP substrate and at least one AlGaInAs quantum well as a gain element,
   a splitter to split light emitted by said superluminescent diode light source to a reference mirror and a sample; and,
   a detector to detect interference between a reflection from said reference mirror and a reflection from said sample.

18. The system of claim 17, wherein said optical coherence tomography system is a time domain optical coherence tomography system, and said detector is a simple broadband detector.

19. The system of claim 17, where said optical coherence tomography system is a spectral domain optical coherence tomography system, and said detector is a spectrally resolved detector.

20. The system of claim 17, wherein said sample is in-vivo human tissue.

21. The system of claim 17, further comprising at least one additional superluminescent diode light source, and means for multiplexing light output from each of said superluminescent diodes.

* * * * *